United States Patent
Jo

(10) Patent No.: US 7,651,949 B2
(45) Date of Patent: Jan. 26, 2010

(54) METHOD OF MANUFACTURING A SEMICONDUCTOR DEVICE

(75) Inventor: Bo-Yeoun Jo, Gimpo (KR)

(73) Assignee: Dongbu Electronics Co., Ltd., Seoul (KR)

( * ) Notice: Subject to any disclaimer, the term of this patent is extended or adjusted under 35 U.S.C. 154(b) by 402 days.

(21) Appl. No.: 11/316,649

(22) Filed: Dec. 20, 2005

(65) Prior Publication Data

US 2006/0141799 A1 Jun. 29, 2006

(30) Foreign Application Priority Data

Dec. 27, 2004 (KR) .................. 10-2004-0113333

(51) Int. Cl.
*H01L 21/302* (2006.01)
(52) U.S. Cl. .................. 438/725; 438/714; 134/1.2
(58) Field of Classification Search .................. 134/1.2, 134/1.3; 438/714, 725, 734; 216/49, 63
See application file for complete search history.

(56) References Cited

U.S. PATENT DOCUMENTS 5,057,187 A * 10/1991 Shinagawa et al. .......... 438/725
7,279,382 B2 * 10/2007 Jo ................................ 438/254
2004/0224520 A1 * 11/2004 Yun et al. ..................... 438/691
2005/0018525 A1 * 1/2005 Kim et al. .................... 365/232
2005/0048786 A1 * 3/2005 Jo ................................ 438/706
2005/0158667 A1 * 7/2005 Nguyen et al. ............... 430/322

* cited by examiner

*Primary Examiner*—Lan Vinh
*Assistant Examiner*—George A Goudreau
(74) *Attorney, Agent, or Firm*—The Law Offices of Andrew D. Fortney; Andrew D. Fortney

(57) ABSTRACT

A semiconductor device may be manufactured by employing an ashing process for removing a photoresist in a process chamber, wherein the ashing process comprises: removing the photoresist for a first predetermined process time by flowing one or more oxygen and nitrogen source gases into the process chamber at first predetermined pressure, power, and temperature conditions; removing a surface portion of a polymer (e.g., from a previous etching process) for a second predetermined process time by flowing a mixture of one or more water source gases (e.g., $H_2O$) and a fluorocarbon (e.g., $CF_4$) into the process chamber at second predetermined pressure, power, and temperature conditions; and removing remaining photoresist for a third predetermined process time by flowing an oxygen source gas (e.g., $O_2$) gas into the process chamber at third predetermined pressure, power, and temperature conditions.

20 Claims, 4 Drawing Sheets

METHOD OF MANUFACTURING A SEMICONDUCTOR DEVICE

CROSS-REFERENCE TO RELATED APPLICATION

This application claims priority to and the benefit of Korean Patent Application No. 10-2004-0113333, filed in the Korean Intellectual Property Office on Dec. 27, 2004, the entire contents of which are incorporated herein by reference.

BACKGROUND OF THE INVENTION (a) Field of the Invention

The present invention relates to a method of manufacturing a semiconductor device. More particularly, the present invention relates to a method of manufacturing a semiconductor device which is capable of suppressing defects that may occur due to a remaining polymer, since polymer produced by a previous etching process can be removed during an ashing process for removing a photoresist on a surface of the device.

(b) Description of the Related Art

A photolithography process for patterning a semiconductor device is one of the most important processes among various manufacturing processes of semiconductor devices. According to a typical photolithography patterning process, photoresist application, soft baking, exposure, baking ("post-exposure" baking), and development processes are sequentially performed. After such a photolithography patterning process, an ashing process is performed for removing the photoresist without causing damage to the semiconductor device, generally using an $O_2$ plasma.

A conventional photolithography and ashing processes will be described in detail with reference to FIG. 1A to FIG. 1D, with an example of a method of fabricating a metal-insulator-metal (MIM) capacitor.

A capacitor used in an analog circuit (for example, a CMOS analog logic circuit) usually has a polysilicon-insulator-polysilicon (PIP) structure or the MIM structure. Different from a MOS capacitor or a junction capacitor, such a capacitor is typically bias-independent, and thus high precision is required.

One may select either the PIP structure or the MIM structure, depending on the target use. For example, the MIM structure is usually used for a semiconductor device intended to operate at a high frequency. In more detail, since the characteristics of the high frequency device are quite dependent on RC delays, the MIM structure using a metal having good electrical characteristics is often selected for such a high frequency device.

Referring to FIG. 1A, a barrier metal layer 13, a metal layer 15, and an anti-reflection coating (ARC) layer 17 are sequentially deposited on an insulation layer 11 in a semiconductor substrate (generally having one or more lower structures below the insulation layer 11, not shown) so as to form a lower metal line. An insulation layer 19 such as a silicon nitride layer is formed on the ARC layer 17. Further, titanium (Ti), titanium nitride (TiN), or a Ti/TiN bilayer is deposited thereon as an upper electrode by a sputtering process so as to form an upper metal layer 21.

Subsequently, an upper electrode photoresist pattern 23 is formed by depositing (usually by spin-coating) a photoresist layer over the entire silicon substrate and then patterning the photoresist layer. Then, a reactive ion etching (RIE) process is performed using the upper electrode photoresist pattern 23 as an etching mask. By the etching process, exposed regions of the upper metal layer 21 and the insulation layer 19 are removed so as to form the upper electrode. A polymer 1 (refer to FIG. 1B) may form on exposed surfaces of the device during such an etching process.

Referring to FIG. 1B, oxygen ($O_2$) gas is inserted into a vacuum process chamber, and then high frequency power (i.e., an RF power) is applied thereto so as to generated a white glow (plasma) discharge. During the ashing process for removing the photoresist pattern 23, O radicals generated by the $O_2$ plasma react with the photoresist so as to form reaction products, and the reaction products are exhausted or removed from the chamber by vacuum. Subsequently, a wet cleaning process is performed in order to remove the polymer 1 produced during the etching of the upper metal layer 21.

However, as shown in FIG. 1B, the polymer 1 produced in the previous etching process may react or otherwise combine with the photoresist and remain on the ARC layer 17. Although the ashing with $O_2$ plasma shows a good ashing rate and good removability, plasma damage may be caused to the device. Furthermore, surface hardening may occur during the ashing process, which may cause adverse effects.

Referring to FIG. 1C, in order to form a lower electrode, another photoresist layer (not shown) is formed by applying a photoresist over the entire structure having the upper electrode. Subsequently, the photoresist layer is patterned such that a lower electrode photoresist pattern 25 partially exposes the lower metal line. At this time, a region 3 may be formed at the lower electrode photoresist pattern 25 by the polymer 1 remaining from the previous processes. The region 3 may function as a partial etch mask, as is explained with regard to FIG. 1D.

Now referring to FIG. 1D, a reactive ion etching process is performed using the lower electrode photoresist pattern 25 as an etching mask. By the etching process, exposed regions of the ARC layer 17, the metal layer 15, the barrier metal layer 13, and the interlayer insulation layer 11 are removed to a predetermined width so as to form the lower electrode. When the region 3 occurs at the lower electrode photoresist pattern 25 in the previous process, it negatively affects the etching process for forming the lower electrode (e.g., by blocking exposure of the ARC layer 17 from the etch process for some period of time). Thus, an unetched region 5 may also occur at one or more layers in or under the lower electrode (e.g., the metal layer 15, the barrier metal layer 13, and/or the insulation layer 11).

As described above, according to the art, a polymer produced during a metal etching process may not be fully removed, and may remain through subsequent processes, thereby resulting in a negative effect such as a partial mask region. In this case, a process margin for a subsequent process may deteriorate, and the yield of semiconductor devices may also deteriorate.

The above information disclosed in this Background section is only for enhancement of understanding of the background of the invention, and therefore, it may contain information that does not form prior art or other information that is already known in this or any other country to a person of ordinary skill in the art.

SUMMARY OF THE INVENTION

The present invention has been made in an effort to improve the yield of semiconductor devices and/or the process margin of processes subsequent to a photolithography, etching and ashing cycle by removing a surface portion of a polymer remaining from the etching step in the ashing step that is typically used for removing a photoresist in the photolithography step.

An exemplary method of manufacturing a semiconductor device according to an embodiment of the present invention includes an ashing process for removing a photoresist in a process chamber. The ashing process according to an embodiment of the present invention includes: removing the photoresist for a first predetermined process time by flowing a first mixture comprising oxygen and nitrogen source gases into the process chamber under first predetermined pressure, power, and temperature conditions; removing a surface portion of a polymer from a previous etching process for a second predetermined process time by flowing a second mixture comprising one or more water source gases (e.g., $H_2O$) and a fluorocarbon gas (e.g., $CF_4$) into the process chamber under second predetermined pressure, power, and temperature conditions; and removing any remaining photoresist for a third predetermined process time by flowing an oxygen source gas (e.g., $O_2$) into the process chamber under third predetermined pressure, power, and temperature conditions.

The ashing process may be performed after patterning an upper electrode with a patterned photoresist on an upper conductor, metal or electrode layer. When the patterned photoresist is on an upper electrode layer, the method may further comprise one or more steps typically performed during fabrication of an MIM capacitor.

While removing the surface portion of the polymer, the fluorocarbon gas (e.g., $CF_4$) may be present in an amount of about 5-15% (by weight, volume or flow rate) of the amount of the water source gas(es) (e.g., $H_2O$).

The first, second, and third predetermined pressure conditions may be the same.

The second predetermined process time may be about 30-50% of the first predetermined process time.

The third predetermined process time may be about 40-60% of the first predetermined process time.

The ashing process may further include removing remaining photoresist for a predetermined process time by sequentially flowing $O_2$ and $O_3$ gases into the process chamber under fourth predetermined pressure, power, and temperature conditions.

DETAILED DESCRIPTION OF THE EMBODIMENTS

An exemplary embodiment of the present invention will hereinafter be described in detail with reference to the accompanying drawings.

FIG. 2A to FIG. 2D are cross-sectional views showing sequential stages of a method of fabricating an MIM capacitor employing an ashing process according to an exemplary embodiment of the present invention. However, the present invention is not limited to an ashing process in a method of fabricating an MIM capacitor. Rather, the present ashing process can be used in methods of fabricating any metal or other conductive structure (e.g., a metal wire layer, a pad for connecting an overlying contact to a metal wire or an underlying contact, an interconnect [or layer in a metal wire] that may comprise a conductor such as titanium nitride, etc.).

An ashing process according to an embodiment of the present invention and a method of fabricating a capacitor employing such an ashing process will hereinafter described in detail with reference to FIG. 2A to FIG. 2D.

Figure 1A:
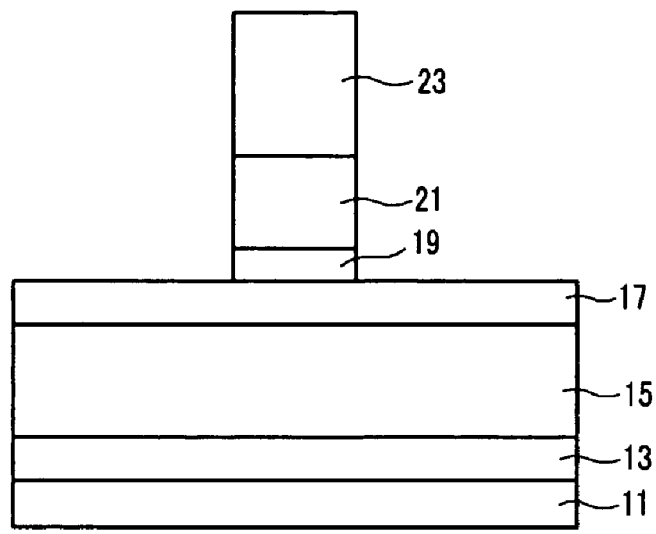
FIG. 1A to FIG. 1D are cross-sectional views showing sequential stages of a conventional method of fabricating an MIM capacitor.
Figure 1B:
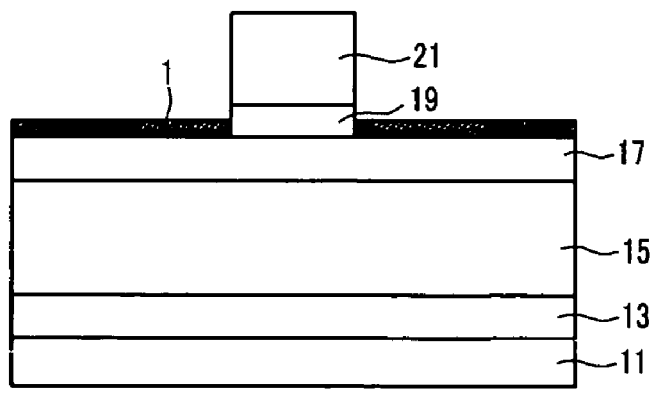
Figure 1C:
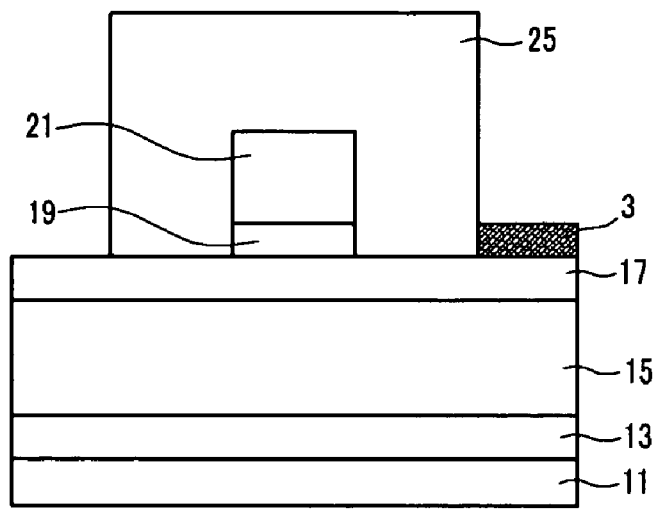
Figure 1D:
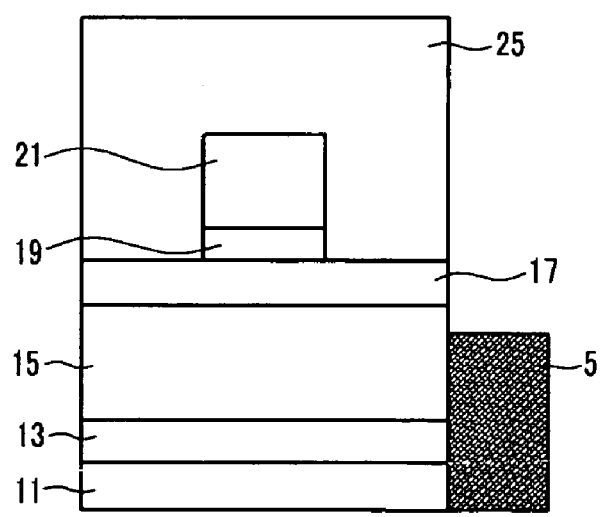
Figure 2A:
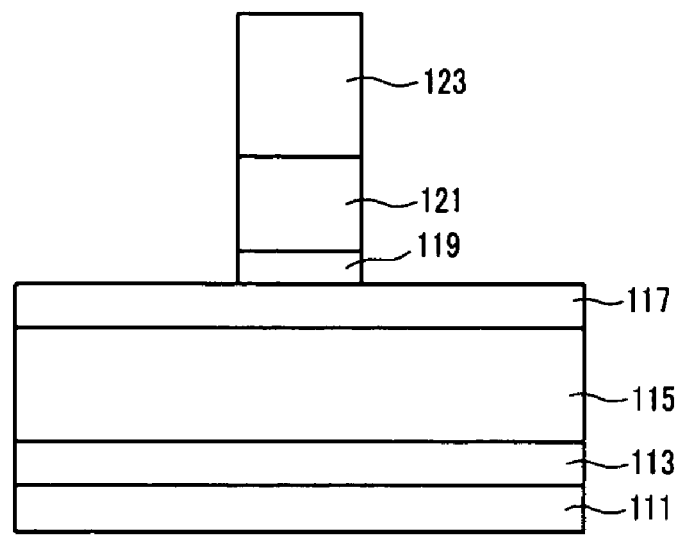
FIG. 2A to FIG. 2D are cross-sectional views showing sequential stages of a method of fabricating an MIM capacitor employing an ashing process according to an exemplary embodiment of the present invention.

Referring to FIG. 2A, a barrier metal layer 113, a metal layer 115, and an anti-reflection coating (ARC) layer 117 are sequentially deposited on an insulation layer 111 on a semiconductor substrate. The insulation layer 111 may be on or over an underlying metallization layer (not shown), and thus, may be considered to be an "interlayer" insulation layer. An insulation layer that forms the capacitor insulator 119 such as a silicon nitride layer is formed on the ARC layer 117. Although other insulators such as silicon dioxide may be used for the insulation layer, silicon nitride may be preferred for purposes related to the dielectric constant (e.g., relative to oxide) and/or cost (relative to other high k dielectrics). Further, titanium (Ti), titanium nitride (TiN), or a combination of Ti and TiN (e.g., a stacked bilayer of TiN on Ti) may be deposited thereon as an upper electrode by a sputtering process so as to form an upper metal layer. As an example, the lower metal line (e.g., the combination of barrier metal layer 113 and a metal layer 115, and optionally anti-reflection coating layer 117 when it comprises a conductive material such as TiN or TiW alloy) may have a thickness of 5000 Å, the insulation layer may have a thickness of 600 Å, and the upper metal layer may have a thickness of 2000 Å.

Subsequently, an upper electrode photoresist pattern 123 is formed by forming a photoresist layer over the entire silicon substrate and then patterning the photoresist layer. As an example, the upper electrode photoresist pattern 123 may have a thickness of 13,000 Å. Then, the upper electrode layer and the insulator layer are etched (e.g., by reactive ion etching) using the upper electrode photoresist pattern 123 as an etching mask, and thus, regions of the upper metal layer and the insulation layer exposed through the upper electrode photoresist pattern 123 are removed by the etching process so as to form the upper electrode 121 and the capacitor insulator 119. However, a polymer may be generated during such an etching process.

The etching process may be divided into two steps, that is, etching the upper metal layer to form electrode 121 and etching the insulation layer to form insulator 119. However, in general, the two steps of the etching process are conducted sequentially (in situ) in the same etching chamber. The following Table 1 shows exemplary appropriate process conditions for the respective steps.

TABLE 1

| Process condition | Pressure | Source power | Bias power | Reaction gas | Process time (seconds) |
| --- | --- | --- | --- | --- | --- |
| Metal layer etching | 8 mTorr | 900 W | 150 W | 50 sccm $Cl_2$ 10 sccm $CHF_3$ 50 sccm Ar | 50 |
| Insulation layer etching | 8 mTorr | 900 W | 150 W | 20 sccm $CHF_3$ 150 sccm Ar | 10 |

Figure 2B:
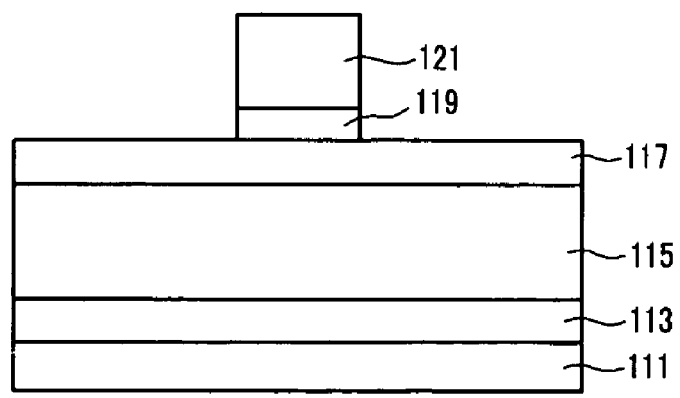

Referring to FIG. 2B, a high frequency power (i.e., an RF Power) is applied to a process chamber so as to generate a white glow (plasma) discharge while flowing various reaction gasses into the process chamber. During the ashing process for removing the photoresist pattern 123, radicals generated by the gas plasma react with the photoresist so as to form reaction products, and the reaction products are exhausted (or removed by vacuum). During the ashing process, the polymer produced during the previous etching process is also largely removed.

The ashing process includes a plurality of steps with variations in the reaction gases selected for each step.

According to an exemplary embodiment of the present invention, the ashing process may comprise as many as nine steps in total as listed in the following Table 2, in which appropriate exemplary process conditions for respective steps are shown.

TABLE 2

| Process condition | Pressure | Power source | Reaction gas | Process time (seconds) | Temperature |
|---|---|---|---|---|---|
| 1st step | 2 Torr | 1400 W | 3000 sccm $O_2$ 3000 sccm $N_2$ | 50 | 250° C. |
| 2nd step | 2 Torr | 1400 W | 750 sccm $H_2O$ 75 sccm $CF_4$ | 20 | 250° C. |
| 3rd step | 2 Torr | 1400 W | 3000 sccm $O_2$ | 25 | 250° C. |
| 4th step | 1 Torr | 1700 W | 2000 sccm $O_2$ | 15 | 250° C. |
| 5th step | 1 Torr | 1700 W | 4000 sccm $O_2$ | 30 | 250° C. |
| 6th step | 1 Torr | 1700 W | 2000 sccm $O_2$ | 30 | 250° C. |
| 7th step | 2 Torr | 0 | 2000 sccm $O_3$ | 20 | 250° C. |
| 8th step | 2 Torr | 2000 W | 2000 sccm $O_3$ | 30 | 250° C. |
| 9th step | 500 mTorr | 2500 W | 2000 sccm $O_3$ | 30 | 250° C. |

At the first step, one or more oxygen and nitrogen source gases (e.g., a mixture of oxygen [$O_2$] and nitrogen [$N_2$], although other oxygen and/or nitrogen source gases such as ozone [$O_3$], nitrous oxide [$N_2O$], and nitrogen oxides such as NO or $NO_2$, some of which can serve as source gases for both oxygen and nitrogen) are introduced into the plasma chamber as the reaction gas, and the photoresist pattern 123 is largely removed. Process times for the respective steps are determined in consideration of the thickness of the targets of the ashing. For example, when the photoresist pattern 123 has a thickness of 13,000 Å, the process time of the first step is set to be about 50 seconds.

At the second step, the reaction gas is changed to a mixture comprising one or more water source gases and a fluorocarbon gas. The water source gas(es) may comprise $H_2O$, a mixture of $H_2$ and $O_2$, or other gas mixture that can provide essentially the same reactive species as water vapor in the plasma conditions employed. The fluorocarbon gas may comprise $CF_4$, $C_2F_6$, $C_3F_8$, or other fluorocarbon of the formula $C_xF_y$ (where y=2x or 2x+2) that can be introduced into the plasma chamber in the gas phase under typical operating conditions. Preferably, at least a surface portion of the polymer (or, alternatively, some or all of the polymer on a surface portion of the lower electrode or on ARC layer 117) that may have been produced during the previous etching process and that may have reacted or otherwise combined with some of the photoresist is substantially removed. At this time, an appropriate amount of fluorocarbon gas (e.g., $CF_4$) is about 5-15% (by weight, volume, or flow rate) of the amount of water source gas(es) (e.g., $H_2O$). With such a gas ratio, quartz used in the apparatus may be protected from erosion by the fluorine (F) group of the $CF_4$. In addition, the process time of the second step may be preferably set to be about 30-50% of the process time of the first step.

At the third step, an oxygen source gas such as $O_2$ gas is used to substantially completely remove the photoresist pattern 123. The process time of the third step is set to be about 40-60% of the process time of the first step. In one embodiment, $N_2$ gas is not used in the third step, so that the process margin of a subsequent wet cleaning process does not deteriorate.

The fourth to ninth steps of the ashing process are employed as optional processes in order to improve removal efficiency of the photoresist pattern 123, and $O_2$ plasma and $O_3$ plasma are used therein.

The pressure (which may be from about 0.1 to about 2 Torr) is generally the same throughout the fourth to sixth steps. The ashing rate of the fourth step is controlled to be lower than that of the fifth step, by using a lesser amount (for example, not more than 2000 or 2500 sccm) of $O_2$. At the fifth step, a substantial amount (for example, not less than 3500 or 4000 sccm) of $O_2$ is used. The amount of $O_2$ at the sixth step is controlled to be as low as that of the fourth step. The power is controlled to be constant throughout the fourth to sixth steps.

The process time of the fourth step is generally about 10-20 seconds. The process time of the fifth step is generally set to be a time extending to end point detection (EPD), and the process time of the sixth step is generally about the same as that of the fifth step.

Throughout the seventh to ninth steps, $O_3$ is used as the process gas. At the seventh and eighth steps, a higher pressure than that of the fourth to sixth steps is used. The pressure may be from about 1 to about 10 Torr, as long as it is higher than that used in the $O_2$ plasma treatment steps. At the seventh step, the RF power is not applied (i.e., the RF power is about 0 W). The pressure at the ninth step is generally low (e.g. from about 0.1 to about 2 Torr, as long as it is lower than that of the preceding $O_3$ plasma treatment step[s]), and the power thereof is generally higher than that of the eighth step.

By such ashing steps using $O_2$ plasma and $O_3$ plasma, the photoresist pattern 123 is generally completely removed such that no photoresist remains. Although O3 plasma ashing results in a low ashing rate, it has been found that its removability under process conditions according to an exemplary embodiment of the present invention (e.g., $O_2$ plasma ashing and additional $O_3$ plasma ashing) is better than that of $O_2$ plasma ashing (alone). When a low ashing rate rather than a high ashing rate is desired, when less plasma damage is intended, or when surface hardening is expected during the ashing process, $O_3$ plasma ashing can be more effective than $O_2$ plasma ashing.

Subsequently, wet cleaning is performed to remove any remaining polymer. Even if the characteristics of the polymer produced during the previous etching process have been changed by a reaction with the photoresist, at least a surface portion of the polymer can be removed during the ashing process, and the remaining polymer may be removed by a wet cleaning process.

Figure 2C:
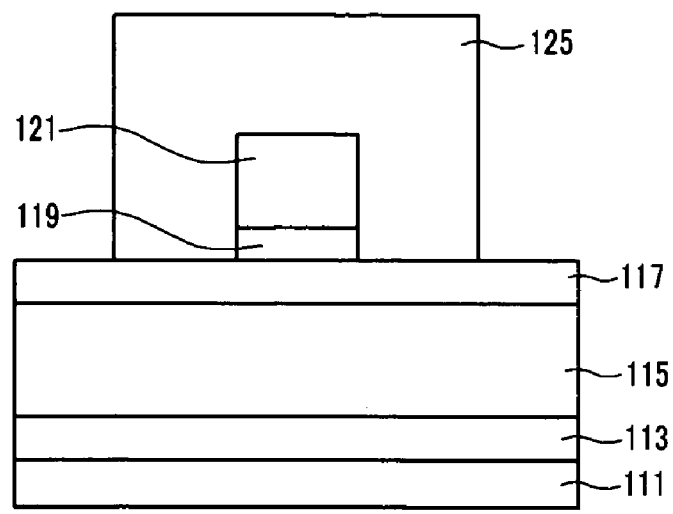

Referring to FIG. 2C, in order to form a lower electrode, another photoresist layer (not shown) is formed by applying a photoresist over the entire structure including the upper electrode. Subsequently, the photoresist layer is patterned such that a lower electrode photoresist pattern 125 partially exposes the lower metal line.

Figure 2D:
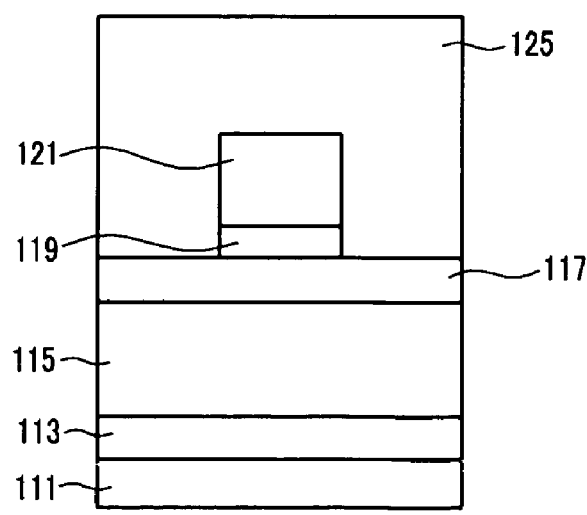

Now referring to FIG. 2D, the lower electrode layers (e.g., the ARC layer 117, the metal layer 115, and the barrier metal layer 113) are etched (e.g., by a reactive ion etching process) using the lower electrode photoresist pattern 125 as an etching mask. By the etching process, regions of the ARC layer 117, the metal layer 115, the barrier metal layer 113, and the insulation layer 111 exposed through the lower electrode photoresist pattern 125 are removed to a predetermined width so as to form the lower electrode.

According to the ashing process of an exemplary embodiment of the present invention, a polymer produced during a post-photolithography etching process is fully removed together with a photoresist, and accordingly, the polymer does not remain in subsequent processes. Therefore, defects from a remaining polymer can be reduced or avoided during subsequent patterning, the process margin(s) may be improved, and the yield of semiconductor devices may be improved.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. An ashing process for removing a photoresist in a process chamber, comprising:
   patterning an upper conductor or electrode with a photoresist on the upper conductor or electrode layer;
   removing a substantial portion of the photoresist by flowing a first reaction gas consisting essentially of a mixture of one or more oxygen and nitrogen source gases into a process chamber under first predetermined pressure, power, and temperature conditions;
   removing a surface polymer by flowing a second reaction gas consisting essentially of a mixture of one or more water source gases and a fluorocarbon gas into the process chamber under second predetermined pressure, power, and temperature conditions; and
   flowing a third reaction gas consisting essentially of an oxygen source gas into the process chamber under third predetermined pressure, power, and temperature conditions, thereby removing the photoresist.

2. The method of claim 1, wherein the fluorocarbon in the mixture is present in an amount of about 5-15% by weight, volume, or flow rate of the amount of the one or more water source gases.

3. The method of claim 1, wherein the first, second, and third predetermined pressure conditions are the same.

4. The method of claim 1, wherein the fluorocarbon gas comprises $CF_4$.

5. The method of claim 1, wherein the one or more oxygen and nitrogen source gases comprise a mixture of $O_2$ and $N_2$.

6. The method of claim 1, wherein the oxygen source gas comprises $O_2$.

7. The method of claim 1, wherein the ashing process further comprises sequentially flowing $O_2$ and $O_3$ gases into the process chamber under fourth predetermined pressure, power, and temperature conditions.

8. The method of claim 7, wherein the fourth predetermined conditions are carried out for a fourth predetermined process time to further remove remaining photoresist.

9. The method of claim 1, wherein the one or more water source gases comprises $H_2O$.

10. The method of claim 9, wherein the fluorocarbon gas comprises $CF_4$.

11. The method of claim 1, wherein the first predetermined conditions are carried out for a first predetermined process time to remove a substantial portion of the photoresist.

12. The method of claim 11, wherein the second predetermined conditions are carried out for a second predetermined process time.

13. The method of claim 12, wherein the second predetermined time is about 30-50% of the first predetermined time.

14. The method of claim 11, wherein the third predetermined conditions are carried out for a third predetermined process time to remove a remaining photoresist.

15. The method of claim 14, wherein the third predetermined time is about 40-60% of the first predetermined process time.

16. An ashing process for removing a photoresist in a process chamber, comprising:
    flowing a first reaction gas consisting essentially of a mixture of one or more oxygen and nitrogen source gases into the process chamber under first predetermined pressure, power, and temperature conditions, wherein the first predetermined conditions are carried out for a first predetermined process time to remove a substantial portion of the photoresist;
    flowing a second reaction gas consisting essentially of a mixture of one or more water source gases and a fluorocarbon gas into the process chamber under second predetermined pressure, power, and temperature conditions, wherein the second predetermined conditions are carried out for a second predetermined process time to remove a surface polymer from a previous etching process; and
    flowing a third reaction gas consisting essentially of an oxygen source gas into the process chamber under third predetermined pressure, power, and temperature conditions, thereby removing the photoresist.

17. The method of claim 16, further comprising patterning an upper conductor or electrode with a photoresist on the upper conductor or electrode layer prior to flowing the one or more oxygen and nitrogen source gases.

18. The method of claim 17, comprising patterning an upper electrode in a metal-insulator-metal (MIM) capacitor.

19. A method of forming an upper electrode in a metal-insulator-metal (MIM) capacitor, comprising:
    patterning a photoresist over an upper electrode layer and an insulator layer;
    etching the upper electrode layer and the insulator layer;
    removing a substantial portion of the patterned photoresist by flowing a first reaction gas consisting essentially of a mixture of one or more oxygen and nitrogen source gases into the process chamber under first predetermined pressure, power, and temperature conditions;
    removing a surface polymer by flowing a second reaction gas consisting essentially of a mixture of one or more water source gases and a fluorocarbon gas into the process chamber under second predetermined pressure, power, and temperature conditions; and
    flowing a third reaction gas consisting essentially of an oxygen source gas into the process chamber under third predetermined pressure, power, and temperature conditions, thereby removing the patterned photoresist.

20. The method of claim 19, wherein the fluorocarbon gas comprises $CF_4$, the one or more water source gases comprises $H_2O$, and $CF_4$ is present in an amount of about 5-15% by weight, volume, or flow rate of the amount of $H_2O$;
    the first, second, and third predetermined pressure conditions are the same;
    the first predetermined conditions are carried out for a predetermined time;
    the second predetermined conditions are carried out for a time of about 30-50% of the first predetermined time;

the third predetermined conditions are carried out for a time of about 40-60% of the first predetermined time; and the ashing process further comprises removing a remaining photoresist for a second predetermined time by sequentially flowing $O_2$ and $O_3$ gases into the process chamber at fourth predetermined pressure, power, and temperature conditions.

* * * * *